United States Patent [19]

Zaengl et al.

[11] 4,338,561
[45] Jul. 6, 1982

[54] HIGH VOLTAGE INSULATION TESTING SYSTEM

[75] Inventors: Walter S. Zaengl, Dübendorf; Felix Bernasconi, Zürich, both of Switzerland

[73] Assignee: Forschungskommission des Sev und VSE für (FKH), Zürich, Switzerland

[21] Appl. No.: 100,703

[22] Filed: Dec. 5, 1979

[30] Foreign Application Priority Data

Dec. 8, 1978 [CH] Switzerland ............... 12545/78

[51] Int. Cl.³ ..................................... G01R 31/12
[52] U.S. Cl. ............................ 323/208; 324/54; 363/37
[58] Field of Search ..................... 323/76, 77, 208; 363/36, 37; 324/54, 61 QS, 61 QL, 57 Q

[56] References Cited

U.S. PATENT DOCUMENTS

| | | | |
|---|---|---|---|
| 2,222,221 | 11/1940 | Burford | 324/61 QL |
| 3,703,692 | 11/1972 | Peschel | 336/134 |
| 3,736,493 | 5/1973 | Rosenthal et al. | 363/37 |
| 3,781,667 | 12/1973 | Tuttle | 324/54 |
| 3,821,640 | 6/1974 | Bahder et al. | 324/54 |

FOREIGN PATENT DOCUMENTS

| | | | |
|---|---|---|---|
| 2060743 | 7/1971 | Fed. Rep. of Germany | |
| 2502771 | 7/1976 | Fed. Rep. of Germany | |
| 44-9560 | 5/1969 | Japan | 363/37 |
| 422977 | 4/1967 | Switzerland | |
| 646756 | 11/1950 | United Kingdom | 324/54 |
| 1243513 | 8/1971 | United Kingdom | |
| 619841 | 7/1978 | U.S.S.R. | 324/54 |

OTHER PUBLICATIONS

High Voltage Engineering, E. Kuffel et al, Pergamon Press, pp. 98-109, Oxford, 1970.
R. Reid, World Electrotechnical Congress, Section 1, Report No. 29, Jun. 21-23, 1977.
Resonant AC Dielectric Test Systems, Hipotronics (Pamphlet Undated).

*Primary Examiner*—William H. Beha, Jr.
*Attorney, Agent, or Firm*—Oblon, Fisher, Spivak, McClelland & Maier

[57] ABSTRACT

The high voltage testing system contains a series resonant circuit connected to a voltage source with a continuously variable frequency, whereby the insulation, connected in series with the inductor, which is being tested, either exclusively or at least partly, forms a part of the capacitance. The inductance may consist of several high voltage inductors constructed of modular elements. It is advantageous to use bar-core chokes.

Preferably, the bar-core choke is suspended in the mass center by means of a mounting plate. Suitably, the coil of the inductor consists of two windings, each having a trapezoidal cross section.

A static frequency converter would be suitable as a voltage source with variable frequency; the converter could be a direct converter built to act as an oscillating circuit converter, operating within the resonance frequency and with pulse-width control. At least one high-voltage capacitor may be connected in parallel to the insulation for the adjustment of the desired frequency. The advantage of this testing system for the testing of an insulation lies in the fact that this system permits testing with frequencies which are lower or higher than the line frequency. The testing system is small and very light-weight and contains elements which are more economical than was heretofore known.

19 Claims, 10 Drawing Figures

HIGH VOLTAGE INSULATION TESTING SYSTEM

BACKGROUND OF THE INVENTION

1. Field of the Invention

The present invention relates to a system for producing high alternating voltages with a series resonant acceptor circuit consisting of a capacitance and an inductance, for use, preferably, in the high-voltage testing of electrical insulations.

2. Description of the Prior Art

Electrical insulations must be tested with high voltages in order to prove their insulating properties. Actually, all insulation operates like a capacitor with low dissipation factor. Usual testing of such insulations is done by means of high-voltage transformers, which means that practically their test load is merely capacitive, yielding reactive power. When testing very high capacitances, for instance high-voltage cables or metalclad, gas-insulated high voltage switch systems, the nominal power of the transformers must be high. Such types of test transformers are expensive and heavy and, in addition, must be fed by a variable high-voltage source, properly dimensioned for the nominal power of these transformers, unless the capacitive idle power is compensated by chokes. This compensation of the idle power may be achieved in two possible ways. If the capacitive current of the insulation to be tested is compensated at the high voltage side of the test transformer by switching a high-voltage choke in parallel to this insulation, the test transformer and the variable voltage-source are relieved. With the second method, a choke for a correspondingly lower voltage is switched parallel to the primary side of the test transformer, so that only the variable voltage source—usually a variable ratio transformer or a.c. generator—is being relieved. Both of these methods are expensive, however, and as a rule are not economical.

It is possible also to compensate the capacitive load by oscillatory circuits. A pamphlet issued by the name of "Hipotronics" (USA, undated), describes high-voltage testing systems with a parallel or series-resonant circuit. These systems are fed by voltage sources with a fixed frequency so that in order to obtain high voltages (in a series-resonant circuit) or a complete or extensive compensation, respectively, of the idle power (in a parallel resonance circuit) continuously adjustable chokes are of necessity directly designed as high-voltage chokes. In "High Voltage Engineering" (E. Kuffel and M. Abdullah, Pergamon Press, 1970, p. 100 et seq.) an embodiment is described in which a continuously variable inductor for low voltages works together with a high voltage transformer, which must be properly dimensioned for the full capacitive load of the insulation to be tested. Thus, in both cases the net feeding power supply is completely relieved of idle power; a variable voltage source, however, is still necessary for the adjustment of the desired voltage, also covering the losses of the oscillatory circuits.

As a rule, the alternating voltage tests of insulations are performed with technical frequency, i.e. both 50 Hz or 60 Hz, for which the commonly known, above mentioned, test transformers as well as the equally aforementioned oscillatory circuits are suited. If different frequencies are to be utilized, however, they will have to be produced by electric machines (generators) which are able to create the sine-waves determined for testing transformers in accordance with international rules for voltages with the necessary power. Inasmuch as the voltages of these generators also must be continuously adjusted over wide areas, they become expensive and complicated. If such generators are utilized to feed the above mentioned oscillatory circuits, they will have to be technically still more complicated, since the frequency (r.p.m.) of the generators will have to be extremely stable in order to maintain the oscillating frequency, and for the voltage to remain stable at the adjusted level. The production of high alternating test voltages with a frequency different from that of the line frequency, by means of the known methods, therefore, is very demanding.

The application of an increased voltage test by means of technical frequency of 50 Hz or 60 Hz, respectively, in winding tests of inductors, power- or high-voltage transformers is impossible wherever a ferromagnetic circuit is present which may be saturated. Furthermore, it is often advisable and necessary to test the electrical insulations with a frequency which is less than, or sometimes also higher than, the line frequency, in order to examine insulating properties in dependence from the frequency. Thus, for instance, aging processes in solid insulating materials which are caused by use in connection with electricity, may be highly advanced by relatively high frequencies (2 kHz), particularly wherever so-called partial discharges take place within the insulating substance, for instance in cavities.

SUMMARY OF THE INVENTION

The invention in particular is based on the task of providing a high-voltage testing system of the initially described type which does not have the disadvantages of those known to the art, and by which frequencies other than those of the mains may be produced with minor effort. This high-voltage testing system is intended for possible universal use, and should be lightweight and easy to transport.

BRIEF DESCRIPTION OF THE DRAWINGS

The object of the invention is explained hereinafter in connection with the accompanying drawings and further advantages are described.

DETAILED DESCRIPTION OF THE PREFERRED EMBODIMENTS

Figure 1:
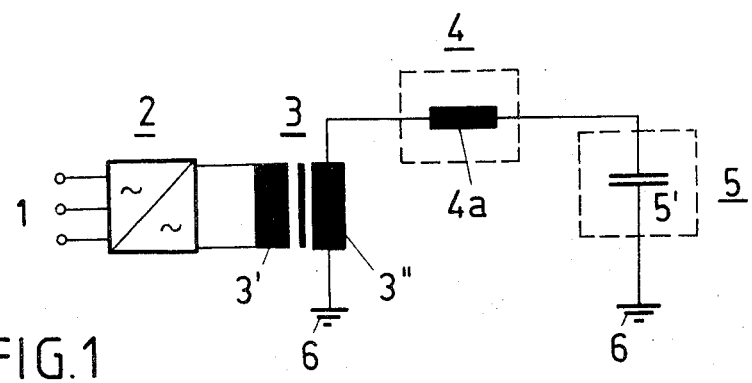
FIG. 1 shows a principal circuit of the invention with a choke and a capacitor which is formed by only the electrical insulation system under voltage test.

According to FIG. 1, converter 2, which is connected to line 1, is a direct frequency converter designed as an oscillating circuit frequency converter, operating within the resonance frequency and with the pulse-width control method. The converter 2 is connected with the primary coil 3' of a transformer 3. One end of the secondary coil 3" is connected with a series resonant circuit, which is formed by an inductor 4 and a capacitor 5. The inductor 4 is a bar-core high-voltage choke 4a and the capacitor 5 is formed by the tested insulation 5'. The secondary circuit is connected to ground 6. Therefore, a current I flows through the series resonant circuit, while a voltage U occurs at the capacitor 5.

Figure 2:
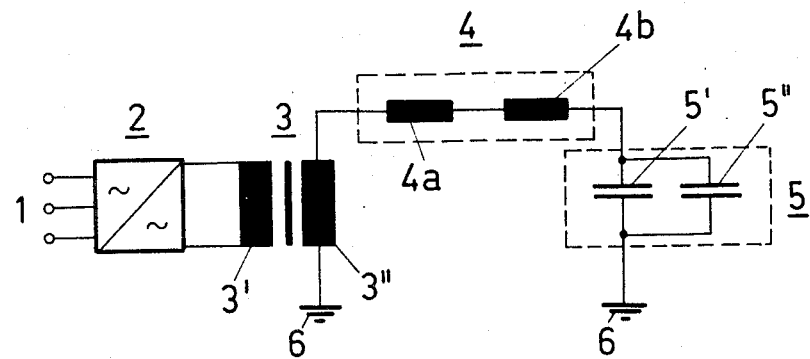
FIG. 2 shows an additional example of a circuit with two chokes in series and a high-voltage capacitor connected in parallel to the tested insulation.
Figure 3:
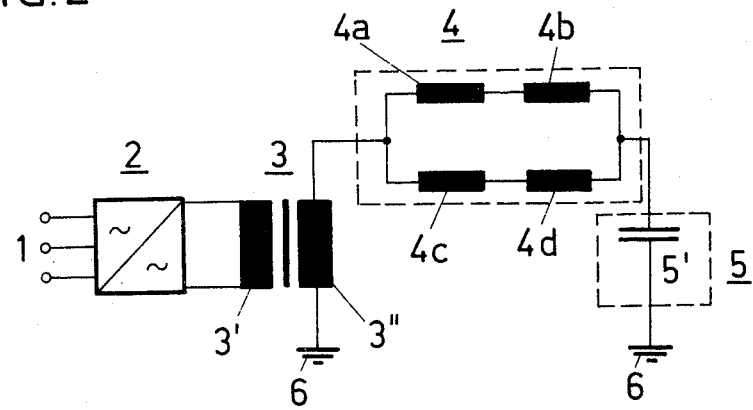
FIG. 3 shows an additional example of an embodiment, whereby the inductance consists of four chokes.

In FIG. 2 and FIG. 3 identical parts are given identical symbols as in FIG. 1.

According to FIG. 2, the inductor is formed by a connection in series of two high-voltage chokes 4a and 4b. A high-voltage capacitor 5" is connected parallel to the insulation 5'.

FIG. 3 shows a further developed embodiment of the invention. The inductor 4 consists of a combination of high-voltage chokes 4a to 4d, designed as modular elements.

By a gradual series and/or parallel connection of the high-voltage chokes 4a to 4d, an optimum load adaption can be achieved, which makes the use of elements of relatively low power and weight possible. In addition, a further adjustment of the acceptor circuit to the insulation to be tested is possible through the use of high-voltage chokes 4a to 4d which have different inductances.

The operation and dimensions of the high-voltage testing system may be further illustrated, using the following information. This will also result in detailed proof of the advantages of the subject of the invention.

The high voltage excited across the capacitor 5 during an indicated resonance, is the result of the fact that the stored energy within the capacitor 5 becomes equal to that of the inductor 4. The frequency $\omega$ or testing frequency f, respectively, thereby is:

$$\omega = 2\pi f = \frac{1}{\sqrt{LC}},$$

whereby L=inductance and C=capacity.

Even with a frequency which only slightly deviates from the test frequency f, there occurs still an essentially higher voltage than that which stimulates the acceptor circuit 4,5 coming from the transformer 3. This increased voltage is caused by the minimal damping within the series resonant circuit 4,5 (value of $170 \geq Q \geq 50$).

Basically, and as a consequence, the voltage at the insulation to be tested can be selected by switching to a frequency different from the frequency $\omega$, at the converter 2. For this purpose, however, in one of the embodiments, a direct converter designed as an oscillating circuit frequency converter with pulse-width control is provided as converter 2.

Accordingly, the amount of inductance 4 is so dimensioned that, in connection with the nominal capacitance $C_N$ to be tested, which also in practice represents the highest capacitance C to be tested, a lowest operating circuit frequency $\omega_N$ appears. The nominal inductance $L_N$ resulting therefrom is calculated by means of the following equation:

$$L_N = \frac{1}{\omega_N^2 \cdot C_N}.$$

The nominal inductance $L_N$, designed as equal modular elements in a preferred embodiment, may be built with a nominal capacitance $C_N$. The voltage at the secondary coil 3" of the transformer 3 may be neglected. The nominal inductance $L_N$ must be able to handle a current $I_N$, for instance, during continued operation. For this the following applies:

$$I_N = U_N \cdot \omega_N \cdot C_N.$$

If only insulations with lesser capacitance values are to be tested, having a value of for instance $C_K$, a higher frequency f is required. This variation of the testing frequency is the immediate result of the above equations. By replacing L by $L_N$ there follows:

$$\frac{\omega}{\omega_N} = \frac{f}{f_N} = \sqrt{\frac{C_N}{C_K}}.$$

whereby $f_N$=nominal frequency. Compare this with FIG. 4.

If, for instance, $C_N = 25 \cdot C_K$, then $f = 5 \cdot f_N$ which is five times greater than such frequency $f_N$ needed for the highest insulation to be tested. The current of the choke $L_N$ used in this connection always remains below the permissible current load in spite of this excess frequency.

This current I, with full testing voltage, assumes the value $$I = U_N \cdot \omega \cdot C.$$

whereby it changes, in consideration of the last two equations, as follows:

$$\frac{I}{I_N} = \frac{\omega C}{\omega_N \cdot C_N} = \sqrt{\frac{C}{C_N}}$$

If, for instance, $C_N = 25C$, then $I = (I_N/5)$. (In this connection, compare FIG. 4.)

It follows from the above, that even with insulations with relatively low capacitances, the chokes are well loaded by the current.

The acceptor circuit with its variable frequency proves to be particularly advantageous in case capacitors which are much higher than $C_N$ must be tested whenever the nominal voltage $U_N$ is reduced. (When using testing transformers there may appear undesirable resonances. When utilizing commonly known resonant circuits with fixed feeder frequency and a variable inductance, the maximum possible in inductance variation prevents this occurrence). For the choke, merely the current $I_N$ presents the load limit. Inasmuch as the choke current $I = U \cdot \omega \cdot C$, and the maximum permissible choke current may be calculated by means of the conditional equation for $I_N$, the current load for the choke may also be expressed by the following, standardized formulation, if it is taken into consideration that, the equally deduced relation for $\omega/\omega_N$ also applies for $C > C_N$:

$$\frac{I}{I_N} = \frac{U}{U_N} \cdot \frac{\omega}{\omega_N} \cdot \frac{C}{C_N} = \frac{U}{U_N} \cdot \sqrt{\frac{C}{C_N}}.$$

Since I can always be equal to $I_N$, it follows that the connection between a testing voltage $U \leq U_N$ to be reduced against the nominal voltage $U_N$ with a permissible greater capacity $C \geq C_N$ is:

$$\frac{U}{U_N} = \sqrt{\frac{C_N}{C}}. \text{ (Compare also FIG. 4.)}$$

For $C = 4 \cdot C_N$ therefore, the testing voltage U must be reduced only by half. For the user, this means the advantage of a great number of possible variations with as little as a single choke.

Since the direct converter of the supply terminal 2 must cover only the losses of the acceptor circuit 4,5 and of the transformer 3, which remain very low as a whole, it is practical to give the converter 2 and the transformer 3 such dimensions as to provide for later reserves for a possible enlargement of the high-voltage system. Such an enlargement may be achieved very simply by a series and/or parallel connection of at least two high-voltage chokes 4a to 4d of equal value.

An additional advantage comes from the series connection of the chokes. With the same nominal frequency $f_N$ or $\omega_N$, respectively, an insulation with the capacity $C_N/2$ may be tested with double the voltage $2 \cdot U_N$, as is immediately evident from the above equations.

When two equal inductors with nominal values $L_N$, $U_N$ and $I_N$ are used in a parallel connection, a capacitor of a size of $2 \cdot C_N$, with the full voltage $U_N$, may be tested again with the frequency $f_N$.

As the variant of FIG. 3 indicates, almost any number of combinations for a variation of the testing frequency f or of the testing voltage U may be realized when using chokes designed as modular elements. For this purpose, equally combined chokes with constant inductance values, as well as others, are equally suitable (e.g., chokes graded in value relations of 1:2 and/or 2:5).

Figure 4:
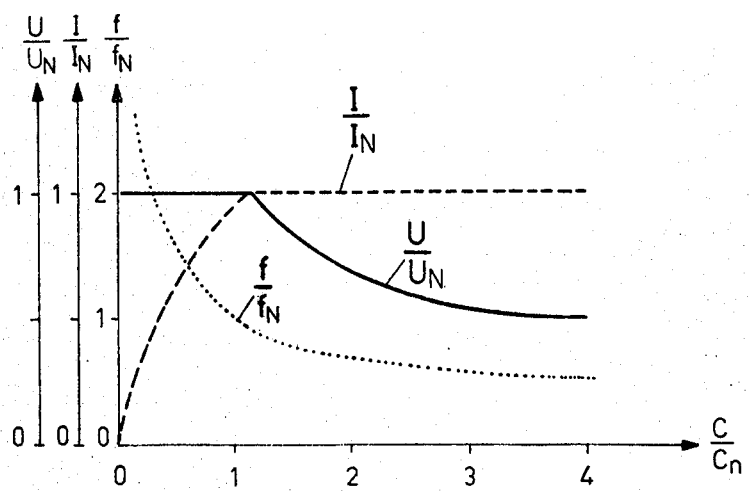
FIG. 4 shows standardized characteristics for the principal circuit of FIG. 1.

The standarized characteristics, as shown in FIG. 4, which have been discussed in detail by means of the above equations, may be applied, respectively, with the utilization of several inductors 4, 4a to 4d, respectively, if the occurring voltage and current loads are taken into consideration.

Figure 5:
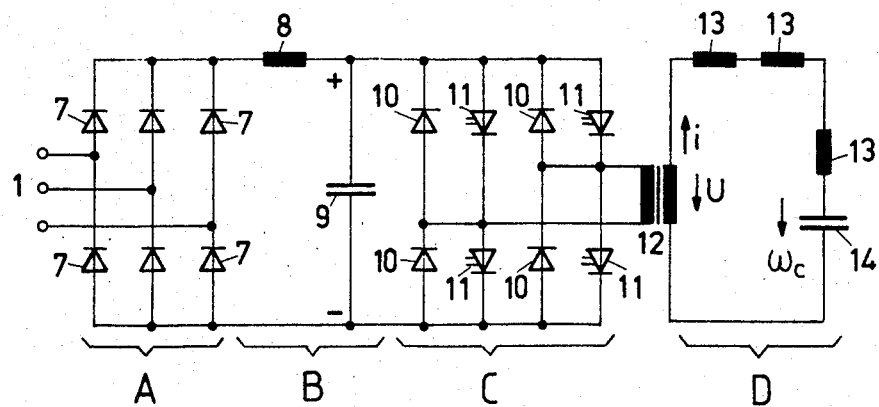
FIG. 5 shows a preferred embodiment of the invention with a static frequency converter.

A preferred embodiment of a high-voltage testing system with an oscillating circuit frequency converter, as shown in FIG. 5, consists of a rectifier A, a d.c. intermediate circuit B, an inverter C and a high-voltage oscillating circuit D. The rectifier A consists of diodes 7 in a bridge circuit and is connected to the main line 1. The d.c. intermediate circuit B contains a choke 8 and a capacitor 9. The inverter is formed by four diodes 10 and four thyristors 11 with resetting devices. An impedance converter 12 connects the inverter C with the high-voltage oscillatory circuit D, which, in this embodiment, contains three chokes 13 and one capacitor 14.

Figure 6:
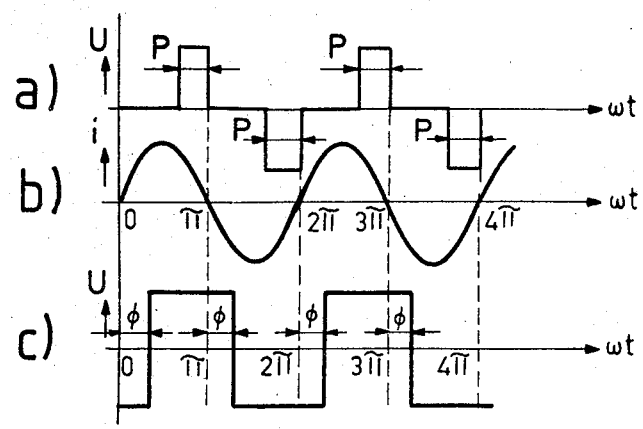
FIGS. 6a to 6c show diagrams of the voltages and the current of FIG. 5 for the adjustment of the testing voltage, with FIG. 6b and 6c electing the use of the phase displacement method, or, alternatively, FIG. 6a and 6b the pulse width control method.

The shape of the voltage U at the input of the oscillatory circuit, according to FIG. 5, can be seen from FIGS. 6a and 6c. The shape of the oscillatory circuit current i is shown in FIG. 6b. In case of a pulse width control, the diagram with variable pulse width P in function of the angle $\omega t$ according to FIG. 6a applies; and with a control via the phase displacement, the diagram according to FIG. 6c with inscribed phase displacement angle $\phi$ applies.

Figure 7:
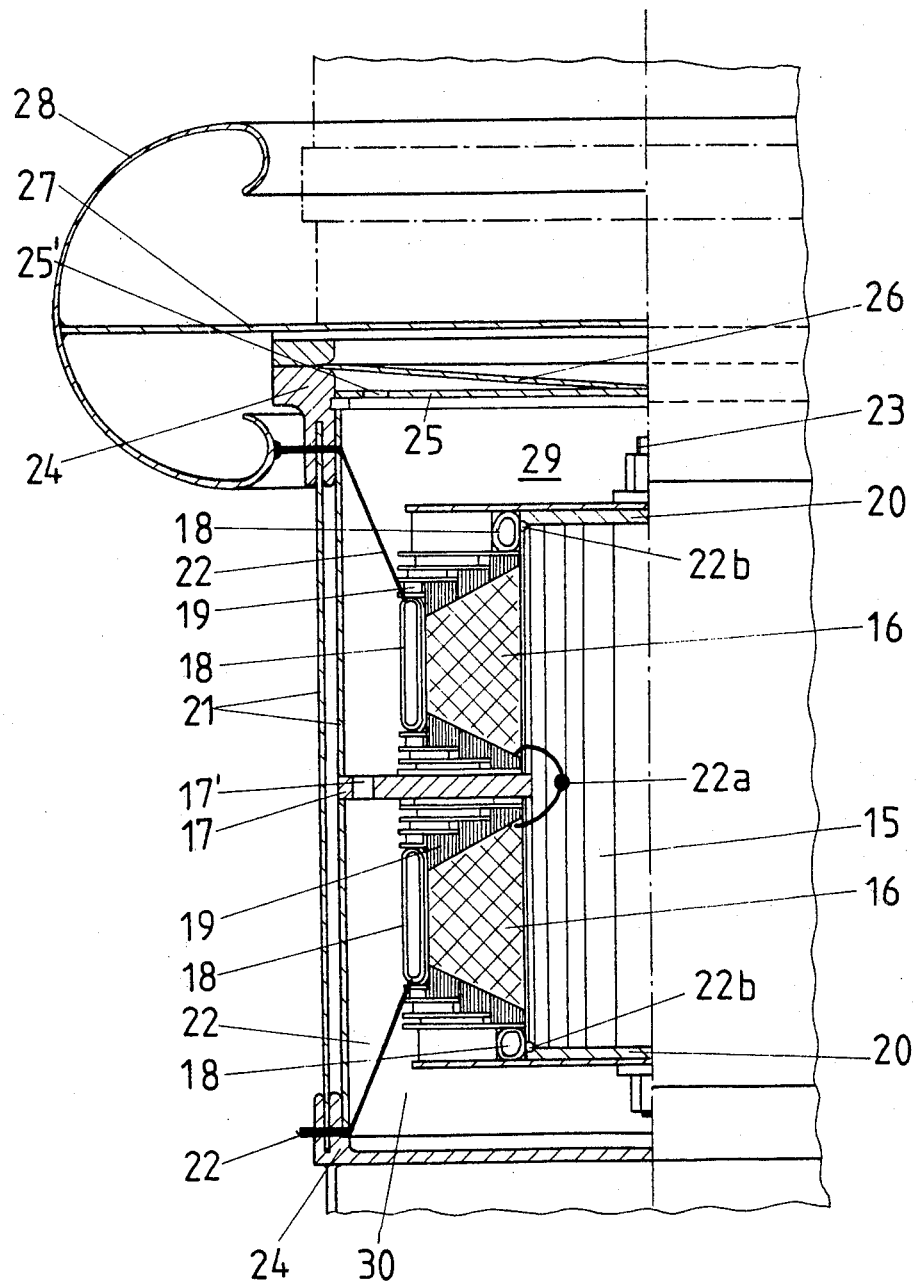
FIG. 7 shows a simplified axial section through an embodiment of a bar-core inductor.

According to FIG. 7, a bar-core choke 29 consists of a radially plated bar-core 15, carrying two windings 16 which make up the coil. Neighboring coiled connections are in contact with each other and with the bar-core 15 by a galvanic connection 22a. These two coils 16 which consist of layers of windings, have a trapezoidal cross section so that the co-axial distances of the layers of windings, located farther towards the outside, become increasingly greater, whereby the resulting distances are also adapted to the potential differences which also increase in the radial direction. The rod-core 15 is suspended in the middle zone by means of a mounting plate 17 made of an insulating material. The mounting plate 17 has at least one bore 17'. High-voltage electrodes 18 shield the coils 16. The support construction of the bar-core choke 29 consists of support plates 20, held together by means of a central bolt and with nuts. The mounting plate 17 is held within a support cylinder 21. The connections of coils 16 are identified by numeral 22. The support cylinder 21 is held at both ends within an electrically insulating bearing construction 24. This bearing construction 24 also holds a membrane 26. Above this bearing construction 24, there is a separating plate 27 holding an annular high-voltage electrode 28 which is designed in such a manner that the magnetic field of the choke does not cause great current losses. An oil chamber of the bar-core choke 29 is designated by numeral 30.

The high-voltage electrodes 18, 28, as well as the disc 25 are made of common metallized transformerboard (by the firm of Weidmann AG, CH-8640 Rapperswil). The support plates are in contact with each of the related high-voltage electrodes 18 by means of galvanic connections 22b.

By using the open magnetic circuit, the relation between mass and power are greatly reduced. Because of the arrangement which was chosen for the construction, an even distribution of the electric field is achieved, making a very compact design possible. In addition, the suspension of the chokes at the center ground facilitates low-noise operation since no magnetic forces (magnetostrictions, etc.) may be directly transferred to the housing. The suspension device is designed as an insulating plate and simultaneously acts as a potential-separator between the two coils, which also acting as a damping device for mechanical vibrations.

The symmetrical design of the choke results in an inductive voltage distribution which equals the capacitive voltage distribution, resulting in an extremely high dielectric strength to surge-voltages of the choke which is particularly important in the instance of a puncture of the test specimen, to avoid disruptive discharge within the choke.

In a realized bar-core choke with a bar-core of 15, with a 200 mm diameter and a length of 440 mm, and an outer diameter of the coils 16 of about 400 mm, a nominal impedance $L_N$ of 51.5 H was measured. With this arrangement—and in accordance with the preceding equations—a test specimen with a capacitance $C_N = 46$ nF, with a test frequency $f_N$ of 103 Hz and a test voltage of 200 kV, producing a current load of 6A, could be tested successfully for the required duration of the test of 10 minutes. A relation mass with power of 0.25 kg per kVA choke power at $f_N$ (103 Hz), 0.5 kg per kVA at 50 Hz, with a short-term operation of 15 minutes, was achieved.

The relation mass/power achieved in this case is comparatively about 30 times less than that achieved with a test transformer and about 10 times smaller than for a series resonance system built for a fixed frequency.

In the case of, as an example, a tandem-series connection of 4 chokes, a testing voltage of 800 kV may be achieved (with $f_N = 103$ Hz and $C_N = 11.5$ nF).

Figure 8:
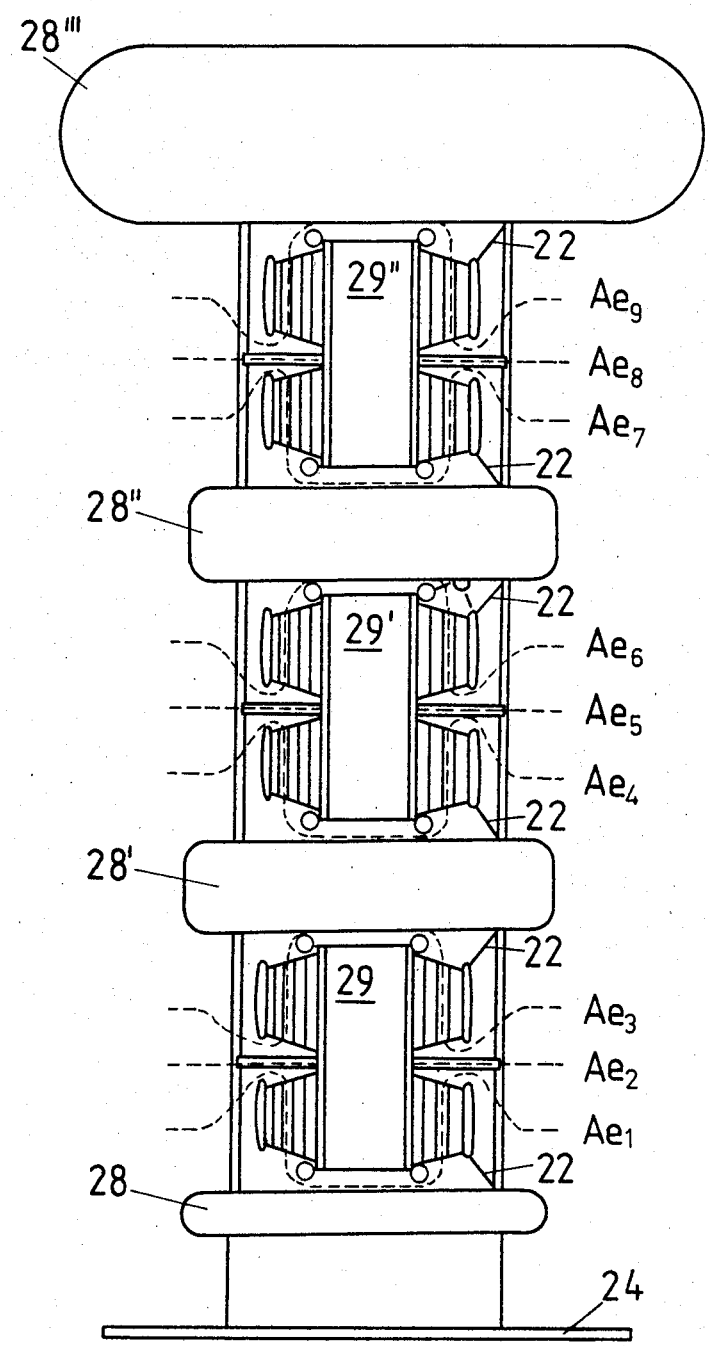
FIG. 8 shows a simplified section through three bar-core chokes stacked as modular elements with inscribed equipotential lines of the resulting electric field.

The principle of modular elements in the arrangement of the bar-core chokes can be seen in FIG. 8.

On a bearing construction 24 there are three equal bar-core chokes 29, 29' and 29" placed within each other, each of which at its end is connected by means of a high-voltage electrode 28 to 28''' galvanically with the pertinent coil 16. The distribution of the electrical field with its equipotential surfaces is sketched in. The equipotential lines characterized by dotted lines are shown in potential differences of 50 kV each: $Ae_1 = 50$ kV; $Ae_2 = 100$ kV = potential of the iron core in contact with the galvanic connection 22a (compare FIG. 7); $Ae_3 = 150$ kV, etc. Correspondingly, the high-voltage electrode 28 has zero-poential, while 28' has a potential of 200 kV, 28" one of 400 kV and 28''' one of 600 kV. All of these listed potentials are effective values. The arrangement has a total building height of about 2,700 mm.

The above described high-voltage testing system is highly adaptable to practical requirements, thus, for instance, and if necessary, HF-filters may be integrated into the acceptor circuit without any problem, in order to conduct partial discharge measurements in a common manner, if necessary.

The chokes, which, in the embodiment shown, are housed within oil chambers, may be encapsulated with $SF_6$, which might be advantageous in particular for mobile testing systems for the high-voltage testing of $SF_6$-insulated metalclad systems. Here, it would also be possible to utilize the insulating gas available at the test site for the insulation and the cooling of the chokes of the testing system.

Obviously, many modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A high voltage testing system for testing the dielectric strength of electric insulation characterized by a capacitive reactance load by generating a rated KVA power in the form of a rated voltage and a rated current across the load, comprising:
   a power source for supplying a KVA power less than said rated KVA power;
   a transformer having a low voltage primary winding and a high voltage secondary winding, said secondary winding rated for a voltage less than said rated voltage and a current equal to the rated current of said reactance load;
   at least one high voltage inductor having a substantially constant inductance value connected in series between said reactance load and said secondary winding, said inductor rated to accept the rated current and rated voltage of said reactance load; and
   said inductor and said reactance load forming a tuned resonant circuit, and said power source having a continuously variable frequency tunable to the resonant frequency of said tuned resonant circuit;
   wherein the resonant circuit excited by said power source produces high reactive power at the rated KVA necessary to test said insulation, with said power source providing only the active power consumed by said resonant circuit;
   wherein said inductor comprises a serial connection of at least two high-voltage chokes with substantially constant inductance values, at least one of said chokes designed in the form of a bar-core choke.

2. A high voltage testing system for testing the dielectric strength of electric insulation characterized by a capacitive reactance load by generating a rated KVA power in the form of a rated voltage and a rated current across the load, comprising:
   a power source for supplying a KVA power less than said rated KVA power;
   a transformer having a low voltage primary winding and a high voltage secondary winding, said secondary winding rated for a voltage less than said rated voltage and a current equal to the rated current of said reactance load;
   a least one high voltage inductor having a substantially constant inductance value connected in series between said reactance load and said secondary winding, said inductor rated to accept the rated current and rated voltage of said reactance load; and
   said inductor and said reactance load forming a tuned resonant circuit, and said power source having a continuously variable frequency tunable to the resonant frequency of said tuned resonant circuit;
   wherein the resonant circuit excited by said power source produces high reactive power at the rated KVA necessary to test said insulation, with said power source providing only the active power consumed by said resonant circuit;
   wherein said inductor comprises a parallel connection of at least two high-voltage chokes with substantially constant inductance values, at least one of said chokes designed in the form of a bar-core choke.

3. A high voltage testing system for testing the dielectric strength of electric insulation characterized by a capacitive reactance load by generating a rated KVA power in the form of a rated voltage and a rated current across the load, comprising:
   a power source for supplying a KVA power less than said rated KVA power;
   a transformer having a low voltage primary winding and a high voltage secondary winding, said secondary winding rated for a voltage less than said rated voltage and a current equal to the rated current of said reactance load;
   a least one high voltage inductor having a substantially constant inductance value connected in series between said reactance load and said secondary winding, said inductor rated to accept the rated current and rated voltage of said reactance load; and
   said inductor and said reactance load forming a tuned resonant circuit, and said power source having a continuously variable frequency tunable to the resonant frequency of said tuned resonant circuit;

wherein the resonant circuit excited by said power source produces high reactive power at the rated KVA necessary to test said insulation, with said power source providing only the active power consumed by said resonant circuit;

wherein said inductor comprises a serial and parallel connection of at least two high-voltage chokes with at least substantially constant inductance values, at least one of said chokes designed in the form of a bar-core choke.

4. A high-voltage testing system as claimed in claims 1, 2 or 3, wherein said high voltage chokes are designed as modular elements.

5. A high-voltage testing system as claimed in claims 1, 2 or 3, wherein said high voltage chokes are designed as identically constructed modular elements.

6. A high-voltage testing system as claimed in claims 1, 2 or 3, comprising plural high-voltage chokes, wherein said high voltage chokes are selected with a value relation of 1-2-2-5.

7. A high-voltage testing system as claimed in claim 1, wherein said voltage supply terminal with a variable frequency consists of a frequency converter to which a transformer is connected thereto.

8. A high-voltage testing system as claimed in claim 7, wherein said converter is a direct frequency converter designed as an oscillating circuit converter, which is operated by the resonance frequency of the resonant circuit and which is able to vary continuously the voltage at the resonant circuit by means of a pulse-width control.

9. A high-voltage testing system as claimed in claim 1, wherein at least one high-voltage capacitor is connected in parallel with said electrical insulation for the adjustment of a desired frequency.

10. A high-voltage testing system as claimed in claim 7, wherein said system is designed as a device with a control of the phase displacement of current and voltage at the output of the converter.

11. A high-voltage testing system as claimed in claims 1, 2 or 3, wherein said bar-core choke is suspended in a housing and has a center of mass-gravity in the center of the mass-gravity of the housing.

12. A high-voltage testing system as claimed in claim 11, wherein the suspension is provided by a mounting plate manufactured from insulating material.

13. A high-voltage testing system as claimed in claims 1, 2 or 3, wherein said bar-core choke is provided with two windings which are arranged separately in the axial direction.

14. A high-voltage testing system as claimed in claim 1, 2 or 3, wherein said bar-core choke is provided with high-voltage electrodes in an annular arrangement.

15. A high-voltage testing system as claimed in claims 1, 2 or 3, wherein said bar-core choke is held within a space filled with a liquid or gaseous insulating material; said space being closed by a bearing construction, a support cylinder and at least one membrane.

16. A high-voltage testing system as claimed in claim 13, wherein the windings of the bar-core choke have trapezoidal cross sections, whereby the wider portions of the trapezoidal cross sections are located on the smaller diameters as compared to the coaxially narrower portions.

17. A high-voltage testing system as claimed in claim 16, wherein the trapezoidal and separated coils of the bar-core choke, in the area of the smallest diameter, are in galvanic connection with the bar-core.

18. A high-voltage testing system as claimed in claim 16, wherein the bar-core choke has a housing and the housing of said bar-core choke in at least one axial direction is provided with a metallized plastic disc.

19. A high-voltage testing system as claimed in claim 18, wherein said bar-core choke has an iron core with at least one air gap in the area of its longitudinal dimension.

* * * * *

UNITED STATES PATENT AND TRADEMARK OFFICE
CERTIFICATE OF CORRECTION

PATENT NO. : 4,338,561
DATED     : July 6, 1982
INVENTOR(S) : Walter S. Zaengl et al.

It is certified that error appears in the above-identified patent and that said Letters Patent is hereby corrected as shown below:

On the title page, assignee should read:

[73] --Assignee: Forschungskommission des SEV und VSE fur Hochspannungsfragen (FKH) Zurich, Switzerland --

Signed and Sealed this

*Fourteenth* Day of *September 1982*

[SEAL]

Attest:

Attesting Officer

GERALD J. MOSSINGHOFF
Commissioner of Patents and Trademarks